(12) United States Patent  
Sato et al.

(10) Patent No.: US 6,674,264 B2  
(45) Date of Patent: Jan. 6, 2004

(54) CELL VOLTAGE DETECTOR FOR FUEL CELL

(75) Inventors: Masahiko Sato, Saitama (JP); Hideaki Kikuchi, Saitama (JP); Toshiaki Ariyoshi, Saitama (JP); Yosuke Fujii, Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/241,272

(22) Filed: Sep. 10, 2002

(65) Prior Publication Data

US 2003/0048091 A1 Mar. 13, 2003

(30) Foreign Application Priority Data

Sep. 10, 2001 (JP) ......................................... 2001-274088

(51) Int. Cl.$^7$ ........................... H01M 10/44; H01M 2/10
(52) U.S. Cl. ........................................ 320/101; 429/100
(58) Field of Search .......................... 320/101; 429/27, 429/40–45, 94, 100, 127, 131–133, 137, 140, 141

(56) References Cited

U.S. PATENT DOCUMENTS 3,960,598 A * 6/1976 Kohlmuller .................. 429/39

FOREIGN PATENT DOCUMENTS

JP 9-283166 10/1997

* cited by examiner

Primary Examiner—Pia Tibbits  
(74) Attorney, Agent, or Firm—Lahive & Cockfield, LLP

(57) ABSTRACT

A cell voltage detector for fuel cell comprising terminals adapted to be brought into abutment with output terminals of separators for a stack, a voltage detecting unit for detecting the cell voltage of the stack through the terminals, a terminal holder for holding one end of the respective terminals and permitting the abutment of the terminals with the output terminals of the separators via a terminal opening opened in a fuel cell cover for encompassing the stack, the terminal holder having a leg portion adapted to be brought into abutment with the periphery of the terminal opening and a terminal cover retained onto the fuel cell cover, so that the terminal cover is brought into abutment with a head portion of the terminal holder on an inner surface thereof and covers the periphery of the terminal opening.

16 Claims, 5 Drawing Sheets

CELL VOLTAGE DETECTOR FOR FUEL CELL

BACKGROUND OF THE INVENTION

1. Field of the Invention

The present invention relates to a cell voltage detector for detecting the cell voltage of a fuel cell.

2. Description of the Related Art

A fuel cell that is installed in a fuel cell powered automobile is, as shown in FIG. 5, formed into a stack in which a number of cells 95 are stacked together which cells 95 are each formed by holding a solid polymer electrolyte membrane 91 such as a polymer ion exchange membrane with an anode 92 and a cathode 93 from both sides thereof and holding in turn the outsides of the anode 92 and the cathode 93 with a pair of separator 94, 94, and each cell 95 includes a fuel gas path 96 into which a fuel gas (for example, hydrogen gas) is supplied and an oxidant gas path 97 into which an oxidant gas (for example, air) is supplied.

In this fuel cell stack, hydrogen ions generated at the anodes 92 through catalytic reaction pass through the solid polymer electrolyte membranes 91 and travel to the cathodes 93, where hydrogen ions react with oxygen to cause electrochemical reaction to thereby generate electricity.

In the fuel cell stack constructed as described above, with a view to discovering cells that are not normal (namely, cells that fail or deteriorate) as early as possible, the electricity generating conditions of the respective cells 95 need to be controlled, and to this end, the voltage of each cell (hereinafter, referred to as cell voltage) is detected.

Then, in order to detect the cell voltage, pairs of separators 94, 94 of the respective cells 95 are connected, respectively, to voltage detection circuits 101 of an electronic control unit (ECU) 100.

Here, a connecting structure disclosed in JP-A-9-283166 is taken as a conventional connecting structure for connecting harnesses 102 connected to the voltage detection circuits 101 with the separators 94. In the connecting structure disclosed in this Japanese Unexamined Patent Publication, a mount hole is opened in each separator for mounting a terminal to the separator, and an output terminal provided at a distal end of each harness is inserted into this hole for connection.

In addition, according to another connecting structure, an output terminal is provided on the separator for measuring the voltage and a connector is provided at a distal end of each harness, so that the connector is connected to the output terminal of each separator.

In either of the conventional connecting structures, however, there is caused a problem that the connected components are easy to loosen or come off when they are subjected to vibrations. In particular, in an on-board fuel cell stack, there are many opportunities where the fuel cell stack is subjected to vibrations, and therefore, this problem cannot be ignored.

In addition, since the connecting portions are exposed, there is also caused a defect that water is liable to have access to the connecting portions so exposed.

SUMMARY OF THE INVENTION

Thus, the invention was made to provide a cell voltage detector for a fuel cell which can attempt to improve the ensured electrical connections between the separators of the fuel cell and the voltage detecting unit, as well as the waterproofness of the connecting portions where the separators and the voltage detecting unit are connected.

With a view to solving the problems, according to a first aspect of the invention, there is provided a cell voltage detector (for example, a cell voltage detector 1 in an embodiment which will be described with reference to FIGS. 1 and 2) for fuel cell (for example, a stack 40 in the embodiment which will be described with reference to FIG. 2) comprising terminals (for example, terminals 6 in the embodiment which will be described with reference to FIGS. 2 and 3) adapted to be brought into abutment with separators (for example, separators 41 in the embodiment which will be described with reference to FIG. 4) for the fuel cell and a voltage detecting unit (for example, a control unit 4 in the embodiment which will be described with reference to FIGS. 1, 2 and 3) for detecting the cell voltage of the fuel cell through the terminals, wherein the cell voltage detector further comprises a terminal holder (for example, a terminal holder 2 in the embodiment which will be described with reference to FIGS. 2 and 3) for holding one end of the respective terminals and permitting the abutment of the terminals with the separators via a terminal opening (for example, a terminal opening 34 in the embodiment which will be described with reference to FIGS. 2 and 3) opened in a fuel cell cover (for example, a fuel cell cover 30 in FIGS. 1 and 2) for encompassing the fuel cell, the terminal holder having a leg portion (for example, a leg portion 7 in the embodiment which will be described with reference to FIGS. 2 and 4) adapted to be brought into abutment with the periphery of the terminal opening and a terminal cover (for example, a terminal cover 3 in the embodiment which will be described with reference to FIGS. 1, 2 and 3) retained on the fuel cell Cover, so that the terminal cover is brought into abutment with a head portion (for example, a head portion 8 in the embodiment which will be described with reference to FIGS. 2 and 4) of the terminal holder on an inner surface thereof and covers the periphery of the terminal opening.

According to the construction, the terminal holder can be held with the fuel cell cover and the terminal cover there between in such a manner as to permit no movement thereof, and furthermore, the fuel cell cover, the terminal holder and the terminal cover can be made integral with each other. Additionally, the terminal holder and the terminal opening in the fuel cell cover can be covered with the terminal cover.

According to a second aspect of the invention, there is provided a cell voltage detector for fuel cell as set forth in the first aspect of the invention, wherein the fuel cell cover has a plurality of said terminal openings (for example, terminal openings 34, 34 in the embodiment which will be described with reference to FIGS. 2 and 3), wherein the terminal cover covers the plurality of terminal openings, and wherein the voltage detecting unit is disposed between the plurality of terminal openings which are covered with the terminal cover.

According to the construction, the space between the terminal openings can be utilized effectively.

According to a third aspect of the invention, there is provided a cell voltage detector for fuel cell as set forth in the first or second aspect of the invention, wherein the terminal holder has an elastic body (for example, a cushion 10 in the embodiment which will be described with reference to FIGS. 2 and 4) at least either at a distal end of the leg portion or at a distal end of the head portion.

According to the construction, vibrations can be absorbed by the elastic body.

According to a fourth aspect of the invention, there is provided a cell voltage detector for fuel cell as set forth in any of the first to third aspects of the invention, wherein the terminal holder has a pair of said leg portions (for example, leg portions 7, 7 in the embodiment which will be described with reference to FIGS. 2 and 4) disposed in such a manner as to straddle the terminal opening, and wherein the terminal holder holds the one end of the terminals between the pair of leg portions.

According to the construction, even when a load is applied from the terminal cover to the terminal holder, the terminal holder is made difficult to be displaced, and as a result, the terminals are made difficult to be displaced.

DETAILED DESCRIPTION OF THE PREFERRED EMBODIMENT

Referring to FIGS. 1 to 4, an embodiment of the invention will be described below.

Figure 1:
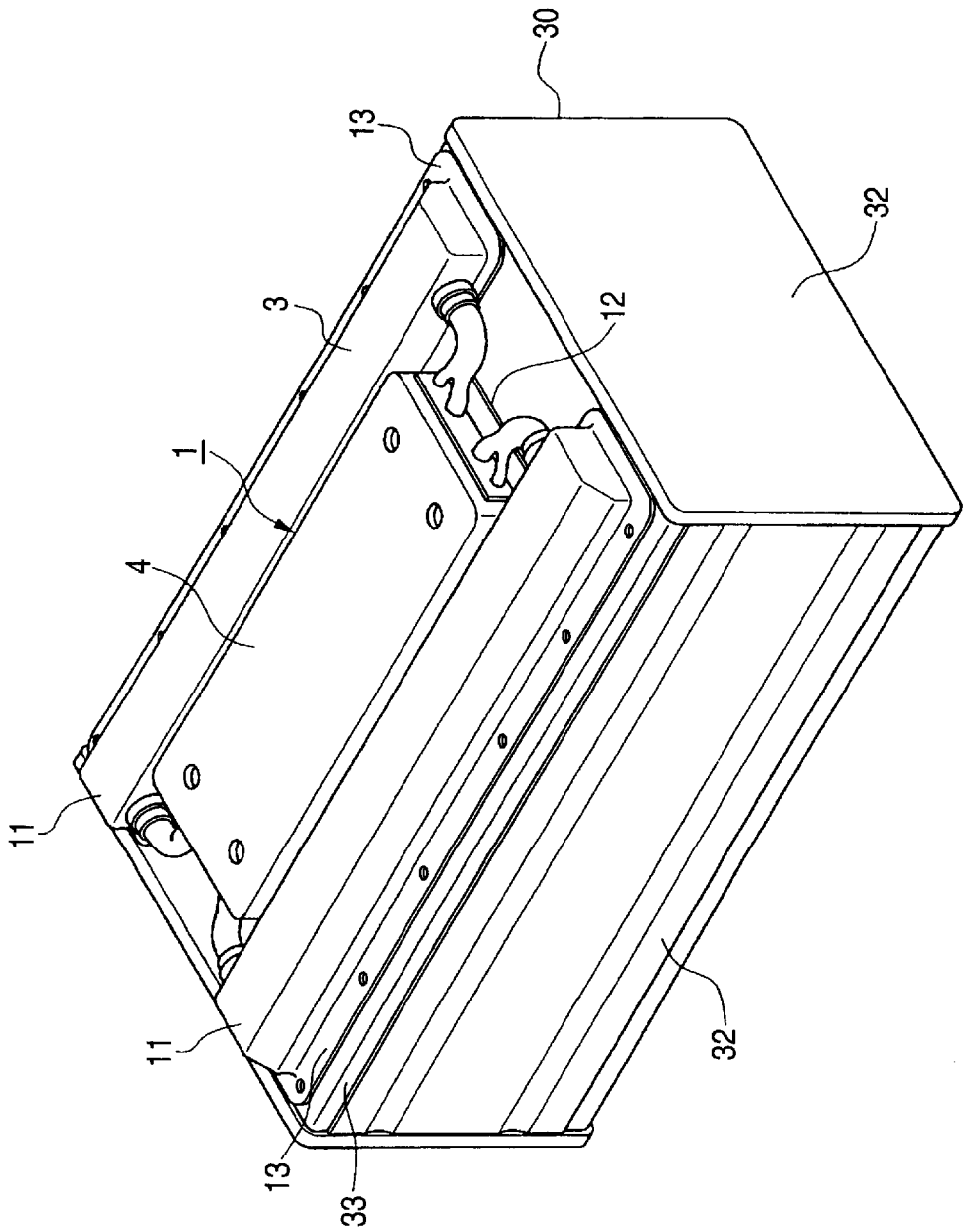
FIG. 1 is a perspective view showing the external appearance of a fuel cell stack equipped with a cell voltage detector according to an embodiment of the invention which is assembled onto the stack.
Figure 2:
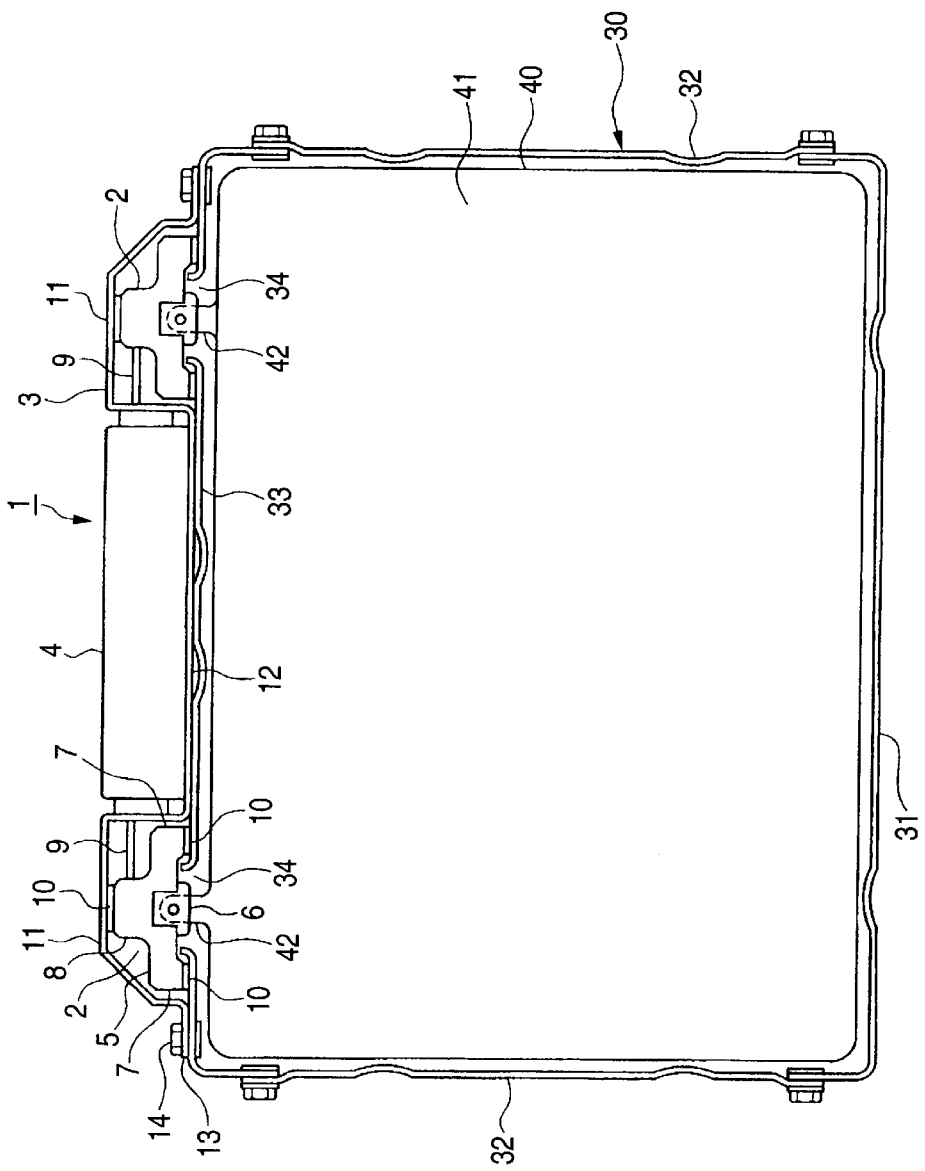
FIG. 2 is a transverse cross-sectional view of the cell voltage detector according to the embodiment and the fuel cell stack equipped with the cell voltage detector.

As shown in FIGS. 1 and 2, a cell voltage detector 1 is placed on an upper portion of a fuel cell cover 30 which encompasses a stack (fuel cell) 40. The basic structure of the stack 40 is identical to that of a conventional one, and therefore, the description of the stack 40 will be omitted herein, or the description thereof will be limited to the illustration in FIG. 2 of a separator 41 which is a constituent component of the stack 40.

The fuel cell cover 30 has a bottom plate 31 for surrounding a bottom portion of the stack 40, side plates 32 for surrounding side portions of the stack 40 and a top plate 33 for surrounding the upper portion of the stack 40. Two elongated terminal openings 34 are opened in the top plate 33 along both side edges thereof. A circumferential edge of the terminal opening 34 in the top plate 33 rises slightly upwards so that the ingress of foreign matters (water drops or the like) into the terminal opening 34 is made difficult.

The separator 41 of the stack 40 is formed by pressing a sheet metal, and an output terminal 42 for measuring the cell voltage is provided along an upper side of the separator 41 at a portion closer to an end portion thereof in such a manner as to extend upwardly therefrom. Note that in this embodiment output terminals 42 are disposed on a right-hand end portion and a left-hand end portion of separators 41 in an alternate fashion as the separators 41 are stacked. The output terminals 42 on the right-hand end portions and the output terminals 42 on the left-hand end portions pass through the right-hand terminal opening 34 and the left-hand terminal opening 34, respectively, which are opened in the fuel cell cover 30 to protrude upwardly therefrom.

Figure 3:
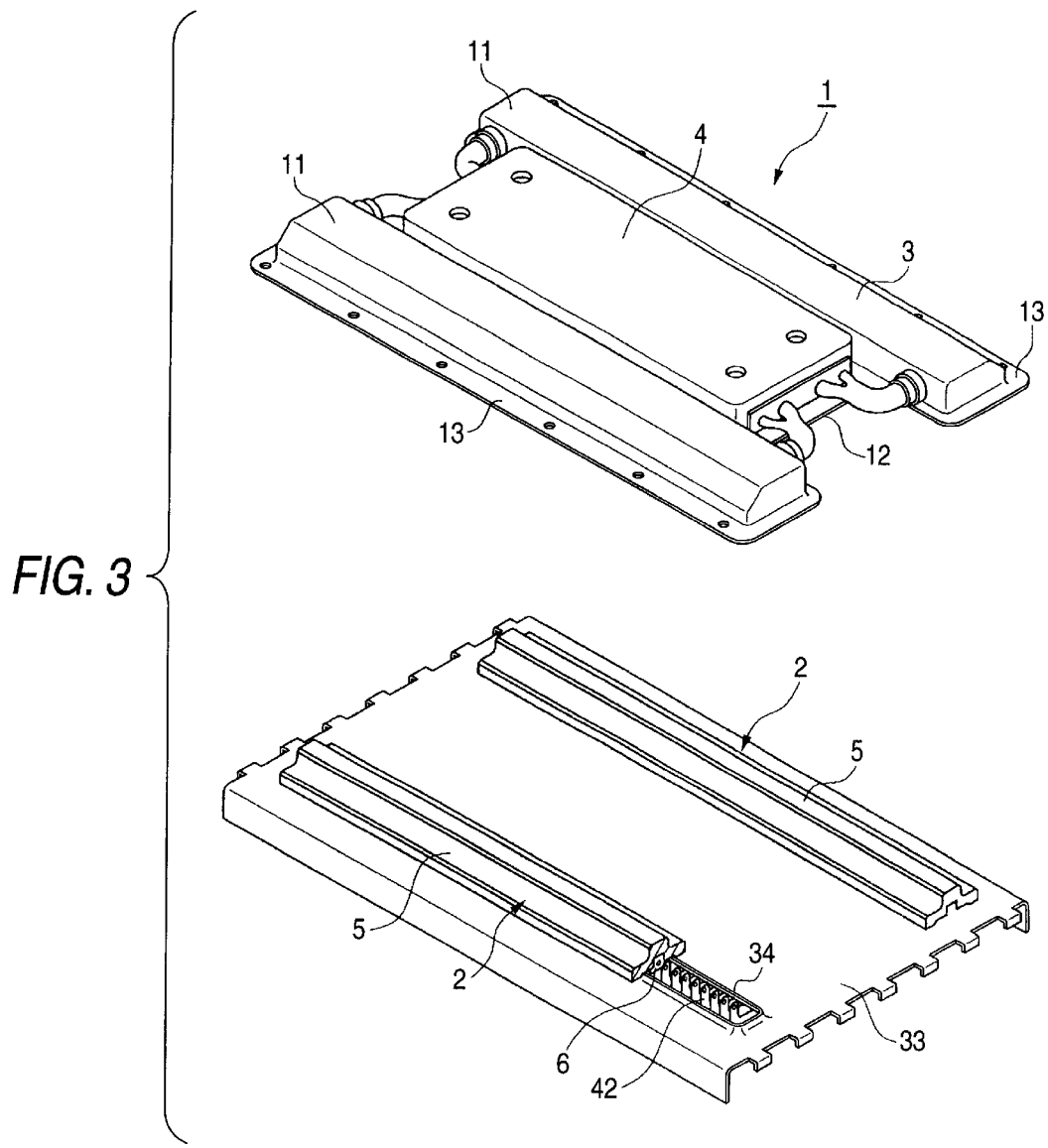
FIG. 3 is an exploded perspective view of the cell voltage detector according to the embodiment.

On the other hand, as shown in FIGS. 2 and 3, the cell voltage detector 1 has two terminal holders 2 disposed in such a manner as to close the terminal openings 34, respectively, in the fuel cell cover 30, a terminal cover 3 which covers both the terminal holders 2 from above and a control unit (a voltage detecting unit) 4 placed on the terminal cover 3.

Figure 4:
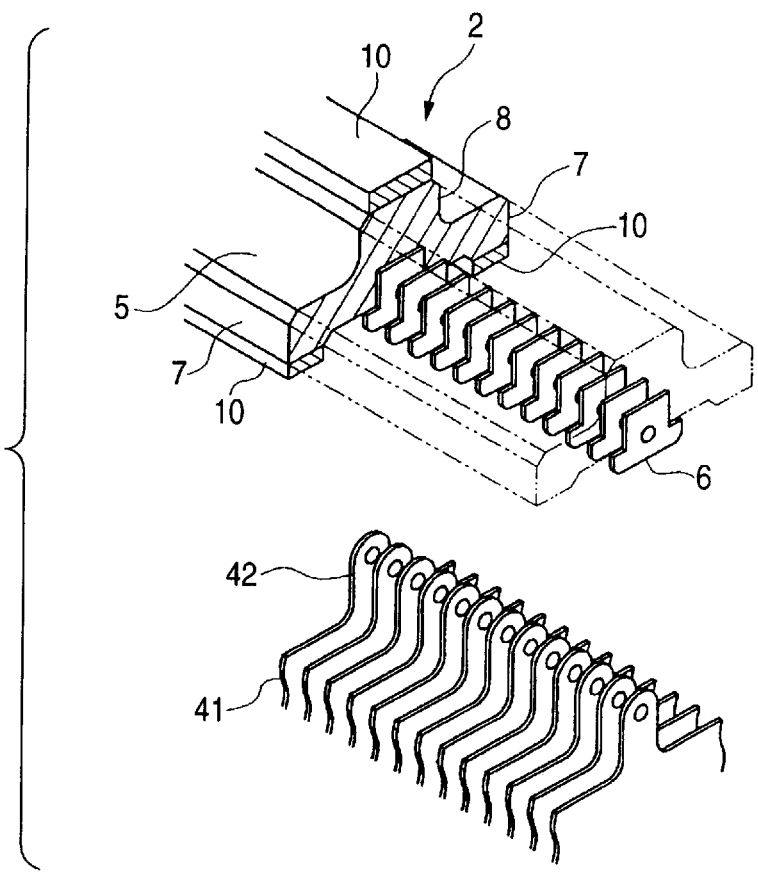
FIG. 4 is a partially cutaway view of a terminal holder according to the embodiment in which part of the terminal holder is cutaway.
Figure 5:
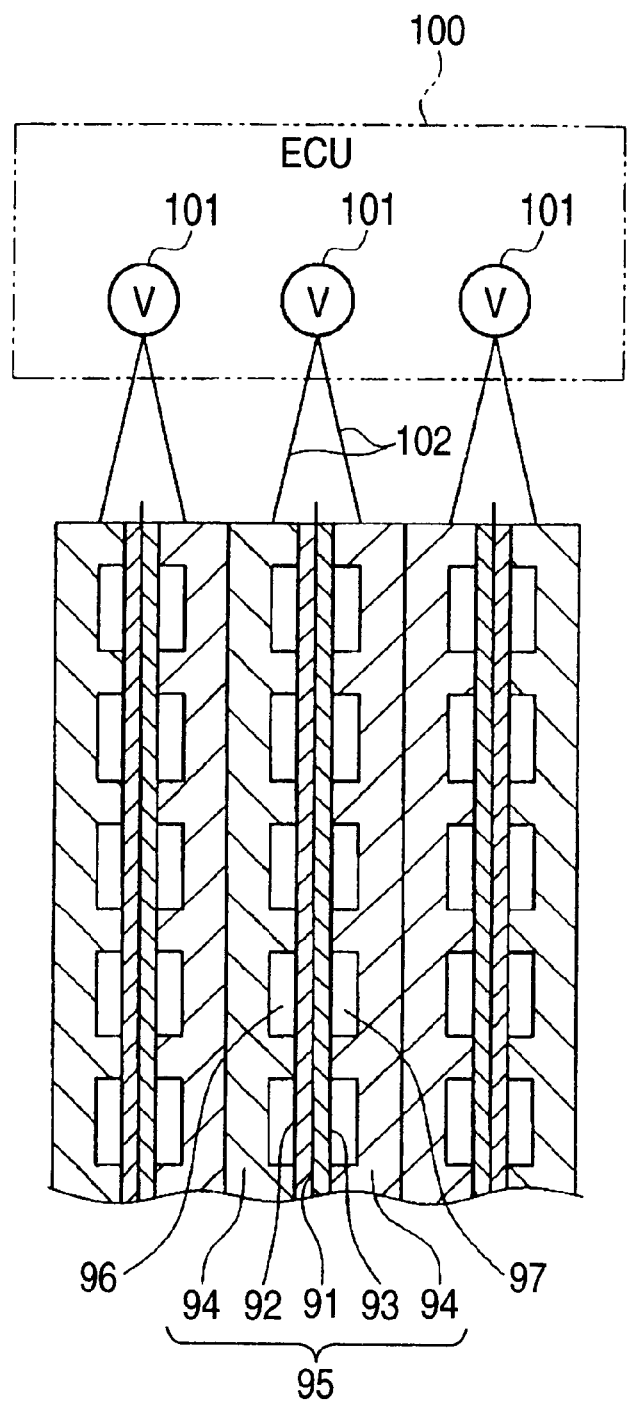
FIG. 5 is a schematic sectional view of a conventional fuel cell stack.

As shown in FIG. 4, the terminal holder 2 has an elongated holder main body 5 having a substantially inverted T-shape cross section and terminals 6 adapted to be brought into abutment with the output terminals 42 of the separators 41 for measuring the cell voltage. To describe in detail, the holder main body 5 has a pair of leg portions 7, 7 which are disposed in such a manner as to straddle the terminal opening 34 and a head portion 8 which connects these leg portions 7, 7 together and expands upwardly. An upper end (one end) of the terminal 6 is fitted in between the two leg portions 7, 7 or embedded in a lower portion of the head portion 8 for fixation, and a lower end of the terminal 6 which is exposed from the holder main body 5 is allowed to be brought into abutment with the output terminal 42 of the separator 41. Note that the holder main body 5 is formed of an insulating material and can be produced by injecting a resin or pressing a sheet metal.

In addition, harnesses (not shown) connected to the respective terminals 6 are also embedded in the holder main body 5, a bundle 9 of the harnesses is drawn out of the holder main body 5.

Additionally, a cushion (an elastic body) 10 made of an elastic material such as rubber is mounted to lower surfaces (distal ends) of the respective leg portions 7 and an upper surface (a distal end) of the head portion 8 of the holder main body 5. Then, the lower surfaces of the leg portions 7, 7 are brought into abutment with the periphery (to be accurate, both sides of the terminal opening 34) in the top plate 33 of the fuel cell cover 30 via the cushions 10.

The respective terminals 6 in the terminal holder 2 and the respective output terminals 42 which correspond to the respective terminals 6 are constructed such that they come into abutment with each other through a single action for connection by pressing the terminal holder 2 downwardly from above the terminal opening 34, whereby the terminals 6 in the terminal holder 2 and the output terminals 42 of the separators 41 are allowed to come into abutment with each other via the terminal opening 34.

The terminal cover 3 is constituted integrally by a pair of elongated box-like cap portions 11, 11 which are opened at lower portions thereof and a flat plate-like connecting plate 12 which connects both the cap portions 11, 11 together. Each cap portion 11 covers each terminal holder 2 from above so as to accommodate the terminal holder 2 therein, whereby an inner surface of a top portion of the cap portion 11 is brought into abutment with the head portion 8 of the holder main body 5 via the cushion 10.

In addition, a flange portion 13 projecting from a lower circumferential edge of the cap portion 11 is secured to the top plate 33 of the furl cell cover 30 with bolts 14. In other words, the terminal cover 3 is in abutment with the head portions 8 of the terminal holders 2 on inner surfaces thereof via the cushions 10 and is retained to the fuel cell cover 30 so as to cover the peripheries of the terminal openings 34, with the terminal holders 2 being held by the fuel cell cover 30 and the terminal cover 3 therebetween.

Then, the connecting plate 12 of the terminal cover 3 is placed in a space between both the terminal openings 34, 34 on the top plate 33 of the fuel cell cover 30, and the control unit 4 is mounted on the connecting plate 12. Namely, the control unit 4 is disposed between both the terminal openings 34, 34. The control unit 4 has voltage detection circuits for detecting the voltage of the respective cells in the stack 40, and the respective terminals 6 in the terminal holders 2 are connected to the voltage detection circuits, respectively, via the harnesses. Then, the respective separators 41 are connected to the voltage detection circuits of the control unit 4 through the connection of the terminals 6 and the output terminals 42.

In the cell voltage detector 1 constructed as has been described heretofore, since the terminal holders 2 are held by the top plate 33 of the fuel cell cover 30 and the cap portions 11 of the terminal cover 3 therebetween, whereby the terminal holders 2 are prevented from moving, the connecting condition of the terminals 6 in the terminal holders 2 and the output terminals 42 of the separators 41 can be retained in an ensured fashion, whereby the disengagement or contact failure between the terminals 6 and the output terminals 42 can be prevented in an ensured fashion.

Furthermore, since the cushions 10 are provided, respectively, between the leg portions 7 of the terminal holders 2 and the top plate 33 of the fuel cell cover 30 and between the head portions 8 of the terminal holders 2 and the cap portions 11 of the terminal cover 3, vibrations, when applied to the fuel cell cover 30 or the terminal cover 3, can be absorbed by the cushions 10. Consequently, since the vibration of the terminal holders 2 can be prevented, the connecting condition between terminals 6 in the terminal holders 2 and the output terminals 42 of the separators 41 can be retained in an ensured fashion, whereby the disengagement or contact failure between the terminals 6 and the output terminals 42 can be prevented in an ensured fashion.

Moreover, the leg portions 7, 7 of the terminal holders 2 straddle the respective terminal openings 34 to thereby be in abutment with the top plate 33 at the sides of the respective terminal openings 34 with the cushions 10 being held therebetween and the upper ends of the respective terminals 6 are held between the leg portions 7, 7 of the respective terminal holders 2. Accordingly, even when a load is applied to the terminal holders 2 via the cap portions 11 of the terminal cover 3, the terminal holders 2 are prevented from being displaced downwardly, and hence the terminals 6 are prevented from being so displaced. Therefore, the connecting condition between terminals 6 in the terminal holders 2 and the output terminals 42 of the separators 41 can be retained in an ensured fashion, whereby the disengagement or contact failure between the terminals 6 and the output terminals 42 can be prevented in an ensured fashion.

In addition, since the fuel cell cover 30 and the terminal cover 3 are integrated by holding the terminal holders 2 therebetween, the rigidity of the fuel cell cover 30 is increased, and as a result, the stack 40 is made difficult to be twisted.

In addition, since the terminal holders 2 and the terminal openings 34 in the fuel cell cover 30 are covered with the cap portions 11 of the terminal cover 3, the connecting portions where the terminals 6 in the terminal holders 2 are connected with the output terminals 42 of the separators 41 can be prevented from being watered, and hence the ingress of water from the terminal openings 34 into the fuel cell cover 30 can prevented.

Furthermore, since the control unit 4 is disposed between both the terminal openings 34, 34 of the fuel cell cover 30 so as to be placed within a space formed between both the cap portions 11 of the terminal cover 3, the detector can be made small in size by utilizing the space effectively.

In addition, since a plurality of terminals 6 in the terminal holder 2 can be connected with the output terminals 42 of the separators 41 at one time only by placing the terminal holder 2 above the terminal opening 34 to be pressed thereinto from above, the assemblage and maintenance of the detector can be facilitated.

Other Embodiments

Note that the invention is not limited to the embodiment that has been described heretofore. For example, while the cushions 10 are provided both at the distal ends of the leg portions 7 and the distal ends of the head portions 8 of the terminal holders 2 in the above embodiment, even if the cushions 10 are be provided only either at the distal ends of the leg portions 7 or at the distal ends of the head portions 8, vibrations can be absorbed.

In addition, while in the above embodiment, the output terminals 42 are provided on the separators 41 in such a manner as to protrude therefrom so that the output terminals 42 project outwardly from the terminal openings 34 in the fuel cell cover 30, thereby making it possible for the terminals 6 in the terminal holders 2 to be brought into abutment with the terminals 42, the terminals 42 may be constructed so as not to project outwardly from the terminal openings 34, and the terminals 6 in the terminal holders 2 may be inserted into the fuel cell cover 30 from the terminal openings 34 so as to be brought into abutment with the output terminals 42 positioned in the fuel cell cover 30.

Additionally, while the control unit 4 is disposed outside the terminal cover 3 in the above embodiment, the control unit 4 may be accommodated inside the terminal cover 3. According to this construction, since the control unit 4 can be prevented from being watered, the construction is more preferable.

What is claimed is:

1. A cell voltage detector for a fuel cell comprising:
   terminals that are brought into abutment with separators for said fuel cell;
   a voltage detecting means for detecting the cell voltage of said fuel cell through said terminals;
   a fuel cell cover at least partially encompassing said fuel cell;
   a terminal holder holding one end of said respective terminals and permitting the abutment of said terminals with said separators via a terminal opening formed in said fuel cell cover, said terminal holder having a leg portion that is brought into abutment with the periphery of said terminal opening; and
   a terminal cover retained onto said fuel cell cover, so that said terminal cover is brought into abutment with a head portion of said terminal holder on an inner surface thereof and covers the periphery of said terminal opening.

2. The cell voltage detector for fuel cell according to claim 1, wherein said fuel cell cover has a plurality of said terminal openings;
   wherein said terminal cover covers said plurality of terminal openings; and
   wherein said voltage detecting means is disposed between said plurality of terminal openings which are covered with said terminal cover.

3. The cell voltage detector for fuel cell according to claim 1, wherein said terminal holder has at least one elastic body disposed on at least one of a distal end of said leg portion and a distal end of said head portion.

4. The cell voltage detector for fuel cell according to claim 1, wherein said terminal holder has a pair of said leg portions disposed in such a manner as to straddle said terminal opening, and wherein said terminal holder holds the one end of said terminals between said pair of leg portions.

5. A cell voltage detector for a fuel cell comprising:

terminals that are brought into abutment with separators for said fuel cell;

a voltage detecting unit electrically connected to said terminals for detecting the cell voltage of said fuel cell;

a fuel cell cover at least partially encompassing said fuel cell;

a terminal holder holding one end of said respective terminals and permitting the abutment of said terminals with said separators via a terminal opening formed in said fuel cell cover; and a terminal cover retained onto said fuel cell cover, wherein said terminal holder is interposed between said fuel cell cover and said terminal cover while being brought into abutment with said fuel cell cover and said terminal cover.

6. The cell voltage detector for fuel cell according to claim 5, wherein said fuel cell cover has a plurality of said terminal openings;

wherein said terminal cover covers said plurality of terminal openings; and wherein said voltage detecting unit is disposed between said plurality of terminal openings which are covered with said terminal cover.

7. The cell voltage detector for fuel cell according to claim 5, further comprising:

at least one elastic body disposed at least either between said terminal holder and said fuel cell cover or between said terminal holder and said terminal cover.

8. The cell voltage detector for fuel cell according to claim 5, wherein said terminal holder has a pair of leg portions disposed in such a manner as to straddle said terminal opening, and wherein said terminal holder holds the one end of said terminals between said pair of leg portions.

9. A cell voltage detector for a fuel cell comprising:

a plurality of terminals that are brought into abutment with a plurality of separators of said fuel cell;

a voltage detecting means for detecting the cell voltage of said fuel cell through said plurality of terminals;

a fuel cell cover at least partially encompassing said fuel cell;

a terminal holder holding one end of said plurality of terminals and permitting the abutment of said plurality of terminals with said plurality of separators via a terminal opening formed in said fuel cell cover, said terminal holder having a leg portion that is brought into abutment with a periphery of said terminal opening; and a terminal cover retained onto said fuel cell cover, so that said terminal cover is brought into abutment with a head portion of said terminal holder on an inner surface thereof and covers the periphery of said terminal opening.

10. A cell voltage detector for a fuel cell comprising:

a plurality of terminals that are brought into abutment with a plurality of separators of said fuel cell;

a voltage detecting unit electrically connected to said plurality of terminals for detecting the cell voltage of said fuel cell;

a fuel cell cover at least partially encompassing said fuel cell;

a terminal holder holding one end of said plurality of terminals and permitting the abutment of said plurality of terminals with said plurality of separators via a terminal opening formed in said fuel cell cover; and a terminal cover retained onto said fuel cell cover, wherein said terminal holder is interposed between said fuel cell cover and said terminal cover while being brought into abutment with said fuel cell cover and said terminal cover.

11. The cell voltage detector for fuel cell according to claim 1, wherein the separators are formed from a sheet metal.

12. The cell voltage detector for fuel cell according to claim 1, wherein the separators have output terminals protruding upwardly from the separators.

13. The cell voltage detector for fuel cell according to claim 12, wherein the output terminals of the separators are disposed to make a plurality of lines on a surface of the fuel cell.

14. The cell voltage detector for fuel cell according to claim 5, wherein the separators are formed from a sheet metal.

15. The cell voltage detector for fuel cell according to claim 5, wherein the separators have output terminals protruding upwardly from the separators.

16. The cell voltage detector for fuel cell according to claim 15, wherein the output terminals of the separators are disposed to make a plurality of lines on a surface of the fuel cell.

* * * * *